United States Patent [19]

Laass

[11] 4,163,937
[45] Aug. 7, 1979

[54] MULTI-FUNCTION TEST APPARATUS TO TEST, SELECTIVELY AND AS DESIRED, ELECTRICAL CIRCUITS, CIRCUIT COMPONENTS AND TRANSISTORS

[75] Inventor: Heinz Laass, Pfungstadt, Fed. Rep. of Germany

[73] Assignee: TACO-Tafel GmbH, Esslingen, Fed. Rep. of Germany

[21] Appl. No.: 869,778

[22] Filed: Jan. 16, 1978

[30] Foreign Application Priority Data

Jan. 31, 1977 [DE] Fed. Rep. of Germany ....... 2703880

[51] Int. Cl.² ........................................... G01R 27/00
[52] U.S. Cl. ............................... 324/57 R; 324/60 C; 324/62; 324/72; 324/73 R; 324/133; 324/158 D; 324/158 T
[58] Field of Search ..................... 324/57 R, 51, 60 C, 324/62, 72, 73 R, 133, 158 D, 158 T

[56] References Cited

U.S. PATENT DOCUMENTS

| | | |
|---|---|---|
| 3,872,384 | 3/1975 | Laass ....................................... 324/51 |
| 4,080,562 | 3/1978 | Rubel et al. ......................... 324/57 R |

FOREIGN PATENT DOCUMENTS

| | | |
|---|---|---|
| 1290629 | 10/1969 | Fed. Rep. of Germany. |
| 1296258 | 1/1970 | Fed. Rep. of Germany. |
| 1616091 | 6/1973 | Fed. Rep. of Germany. |
| 1303813 | 7/1973 | Fed. Rep. of Germany. |
| 1900180 | 10/1974 | Fed. Rep. of Germany. |
| 2320808 | 11/1974 | Fed. Rep. of Germany. |
| 2304211 | 3/1975 | Fed. Rep. of Germany. |
| 2311012 | 10/1977 | Fed. Rep. of Germany. |

OTHER PUBLICATIONS

Reay, Simple Transistor Tester, Radio & Electronics Constructor, Jun. 1976, pp. 688, 689.
Stoner, Semiconductors, C Q, Mar. 1960, pp. 78, 79.

*Primary Examiner*—Stanley T. Krawczewicz
*Attorney, Agent, or Firm*—Frishauf, Holtz, Goodman & Woodward

[57] ABSTRACT

An acoustic output electrical tester has externally accessible test terminals and internal test switches. The tester includes a multivibrator circuit which provides an output tone, the pitch of the tone, and its presence or absence, providing an indication with respect to the impedance, or transistor being tested. The externally accessible terminals can be selectively connected to a transistor, with the switching function replacing the externally connected transistor in the circuit of the multivibrator. A conductivity type reversal switch is provided to place the externally connected transistor in an internal circuit appropriate to the two conductivity types of the transistor. A multi-function testing circuit is also provided having a resistance standard circuit and a reactive impedance standard circuit with an impedance-resistance selector switch and a test-standard transfer switch to selectively connect switch terminals to the externally accessible terminals or to the respective internal standard, so that a comparison of the pitch of oscillation of the tone generator can be used to match impedances, the value of which is indicated, for example, on a scale of the tester to an externally connected impedance.

37 Claims, 5 Drawing Figures

MULTI-FUNCTION TEST APPARATUS TO TEST, SELECTIVELY AND AS DESIRED, ELECTRICAL CIRCUITS, CIRCUIT COMPONENTS AND TRANSISTORS

Cross reference to related patent by the inventor hereof: U.S. Pat. No. 3,872,384, Mar. 18, 1975.

The present invention relates to a test apparatus for electrical networks, circuits, circuit components, and transistors, and more specifically to a tester which provides an audible tone output, the pitch of which, or its absence being an indication of a test condition.

BACKGROUND AND PRIOR ART

Various types of acoustic test apparatus have previously been proposed. The cross referenced earlier U.S. Pat. No. 3,872,384 discloses an apparatus to test continuity of circuits, insulation between conductors of electrical wiring, to determine voltage levels of energization in a circuit, and to provide an indication of the resistance in circuits by causing a multivibrator oscillator, powered by a local battery to oscillate at a predetermined tone, or pitch under certain conditions, the tone or pitch being modified, or the oscillations being suppressed if externally connected networks or impedances are connected to output test terminals of the apparatus.

Various types of acoustic testers have also been proposed which, usually, are limited in use, being primarily suitable to test for circuit continuity, circuit resistance, voltages, or polarity. Optically indicating testers are well known for many parameters. Optical indication, however, is frequently difficult to observe and contributes to the work load of the operator, specifically of maintenance personnel in industrial or plant establishments. In many installations it is difficult to read optical indicating pointers while simultaneously observing safety requirements or properly connecting test prongs. The positioning of optically indicating apparatus is sometimes difficult. Many of the optical indicators are comparatively restrictive in application and thus a number of them must be used for complete testing in industrial environments.

THE INVENTION

It is an object to provide an electrical acoustic output tester which is independent of power networks, can readily be operated by even semi or unskilled personnel when installing, maintaining, or repairing electrical apparatus and systems, which is small, lightweight yet versatile and can be used even under unfavorable working conditions. Additionally, and particularly in view of the continuous increase of electronics in industrial environments, particularly in instrumentation and control circuits, it should be capable of carrying out quantitive as well as qualitative tests of voltage, resistance, capacity, or parameters which use change in any one of these values as a measuring base.

Briefly, in accordance with the invention, an acoustic output electrical tester is used, having a circuit structure essentially similar to that disclosed in my earlier U.S. Pat. No. 3,872,384, in combination with a multi-function testing circuit which has input terminals connectible with an accoustic tester, output terminals selectively connectible with a circuit or electrical circuit components, a resistance standard circuit and a reactive impedance standard circuit. To change over between measurement of resistance, or impedance, an impedance-resistance selector switch is provided, the circuit additionally including a test-standard transfer switch which is selectively connectable to the resistance standard circuit or to the impedance standard circuit, as selected by the impedance-resistance selector switch. When the test-standard switch is in the "standard position," a closed circuit is established from the input terminals to the selected standard circuit while disconnecting the output terminals, so that generation of a tone in the transducer of the acoustic output tester will provide a reference tone and permit, upon changeover of the transfer switch to the "test position," comparison with a component or circuit connected to the output terminals. When in the "test position," a closed circuit is established from the input terminals to the output terminals to permit comparison of the pitch of tone from the transducer at that time, or under those conditions with the output tones from the transducer when the switch is in the "standard position," and hence provided judgement based on the deviation of the tone from the transducer when the connection is changed. Preferably, the standard circuits are adjustable, with values indicated on a scale so that, upon determination of equality of pitch regardless of position of the transfer switch, a reading can be obtained representative of the unknown component or circuit connected to the output terminals.

To test transistors, the test-standard switch is connected internally on the oscillator, and the externally accessible terminals have the customary emitter-base-collector connections, permitting connection of an external semiconductor as a replacement for the transistor of the multivibrator oscillator circuit in the acoustic output electrical tester, that is, in the multivibrator oscillator therefor. A conductivity reversal switch is provided so that transistors of either conductivity types can be tested and inserted, selectively, in lieu of, and matched to the internally provided transistors of the multivibrator oscillator circuit.

Figure 1:
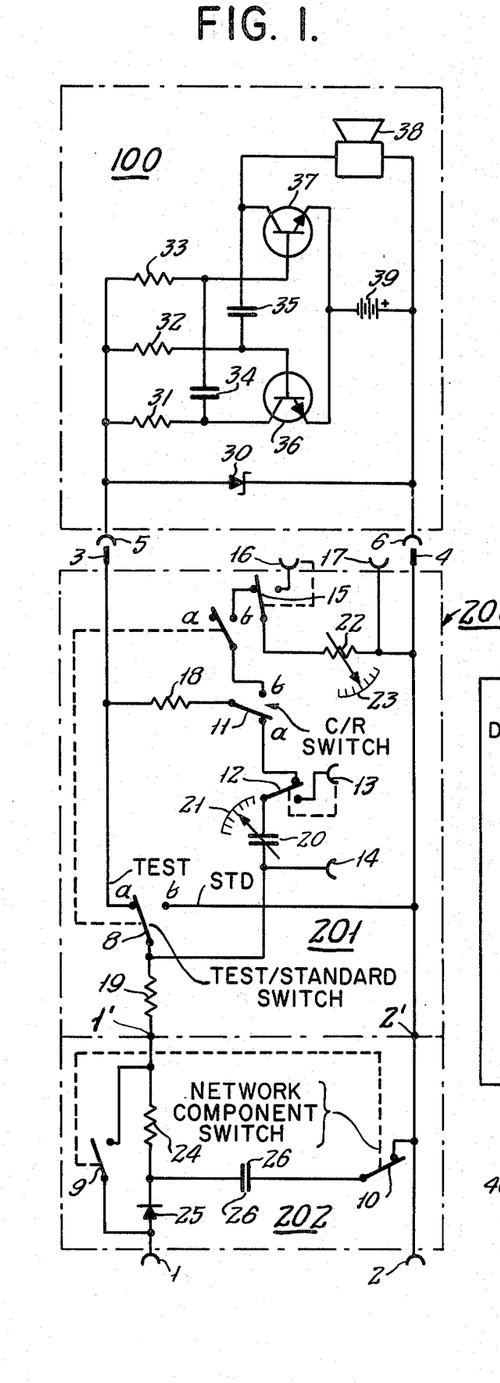
FIG. 1 is a schematic circuit diagram of an acoustic output electrical tester in combination with a multi-function testing circuit.

Referring first to FIG. 1: the acoustic output electrical tester 100 has tester output terminals 5, 6 which can be connected to input terminals 3, 4, respectively, of the multi-function testing circuit 200. The multi-function testing circuit 200 is used to, selectively, connect external impedances in circuit with the acoustic tester. As used herein, the term impedance, can represent a real, resistance component, or an imaginary reactive component. It may be a passive component, that is, the impedance may have a positive value, or it can be a negative impedance, for example a circuit connection which has a voltage appear thereat, as will be described in detail below.

The acoustic output electrical tester 100 has a multivibrator circuit with a wellknown R/C network including resistors 31, 32, 33 and capacitors 34, 35 which are cross coupled to two transistors 36, 37 as shown. A local power source formed by a battery 39 provides power to the circuit. The circuit will oscillate at the predetermined frequency, which can be heard on a transducer 38, for example a small loudspeaker, earphones, or the like. The frequency of oscillation, determining the pitch of the tone from transducer 38 will be determined by the impedance across the output terminals 5, 6. A Zener diode 30 is connected across the output terminals as a protective element.

The circuit is enabled by connecting terminals 5, 6, to permit the oscillator to oscillate and provide a tone from the loudspeaker 38 which will persist as long as there is a connection between terminals 5, 6. The frequency, or pitch of the tone will depend on the electrical parameter of the impedance connected across terminals 5, 6, and the values of resistance and capacitors of components 31–35.

The multi-function testing circuit 200 contains transfer switches and standard circuits to permit quantitative and qualitative tests to be carried out. A capacitor/resistor selector 11 permits choice between a standard capacitor 20 or a standard resistor 22. A test-standard transfer switch has two switching sections 7, 8, which are ganged together and are under manual control. Preferably, they provide for both momentary contact and holding function between changeover. Comparison of the pitch from transducer 38 is carried out by selectively and alternatingly connecting an external test circuit to output terminals 1, 2 through the multi-function test circuit 200 and to the terminals 5, 6, of the acoustic output tester; or, selectively, to form an internal circuit between the terminals 3, 4, of the multi-function circuit and hence between the terminals 5, 6 of the tester.

Operation, and circuits:

(1) To test an impedance, and particularly a capacitor: Let it be assumed that a capacitor is connected to terminals 1, 2, which is to be compared with standard capacitor 20. The capacitor/resistance (C/R) transfer switch 11 will be placed in the position drawn in FIG. 1, that is, with terminal a connected. Switch 9, forming a short-circuit bypass of a network/component switch of a network-component selecting section 202 of the circuit 200 is closed. Switches 9, 10 of section 202 are ganged together, and in the position shown are used to test for voltage at the power network. To test for a component, switch 9 is closed and switch 10 is open. A closed circuit will then be established as follows: Positive terminal (+) of battery 39 over terminals 6-4-2 to one terminal of the capacitor to be tested (not shown); from the other terminal of the capacitor to be tested, terminals 1, switch 9, resistor 19, test-standard (T/S) switch 8a, connection 3, 5 to the multivibrator of tester 100. If a properly functioning capacitor was connected between the output terminals 1, 2, a tone will be obtained from the speaker 38 during charge current flow, but not thereafter.

To obtain a quantitative indication, the T/S switch forming terminal switch sections 7, 8, are changed over. Switch 7 actually is not needed in this test, switch 8 being the only one which is operative. Switch terminal 8b will thus be connected which closes the test circuit through the test capacitor between terminals 1, 2, over resistor 19, so that the capacitor therein will discharge. Additionally, a new circuit path is established for the tester 100 as follows: positive terminal (+) of battery 39, connection 6, 4, T/S switch 8b, capacitor 20, switch 12, C/R switch 11a, resistor 18, and terminals 3, 5, back to the acoustic tester 100.

The resistors 18, 19 should have the same resistance value so that the capacitor 20 will charge under the same conditions as the capacitor between terminals 1, 2. Upon repeated operation of T/S switch, so that the transfer contact 8 will again reach the position 8a, a new circuit will be established over terminals 1, 2, for the tester 100, the capacitor 20 discharging over resistor 18. By changing the value of the capacitor 20, which, as shown, is adjustable, or permits inclusion of various capacity values in circuit, and the value of which can be read on a scale 21, a comparison between the time and pitch of the tone derived when capacitor 20 is charged, or when a test capacitor is charged, can be readily determined. Upon match of this time, the capacitor which is externally connected and capacitor will be the same.

Sufficient accuracy can usually be obtained with a little practice. Repeated operation of the T/S switch and continuous correction of the capacity value of the standard capacitor 20 will rapidly lead to an accurate setting of the capacitor 20. When the time of the tone for either capacitor is the same, the value can then be read on the scale 21. This scale can be set to indicate not only capacity values, but may be set to show whatever values or parameters are desired, the capacity being externally connected then being representative of such other values. For example, if the external capacity connected to terminals 1, 2, corresponds to a certain length of a cable, then the reading on the scale 21 can indicate cable length, for example in meters.

For some tests it is desirable to provide a standard accurate comparison resistor or capacitance, rather than the resistor 22 or capacitor 20 in the standard section 201 of the multifunction testing circuit 200. A standard capacitor can be connected to terminals 13, 14, and a standard resistor to terminals 16, 17, the connection 13 and 16, respectively, being interlocked with a switch 12, 15, respectively, so that when an external standard is inserted at the respective terminals, the internal standard capacitor 20, or the resistor 22, is automatically disconnected. Such external comparison elements or components may have fixed standard values for testing of certain standard components. For example, it may be desirable to test if the duration of tone from the transducer 38 is longer or shorter than a predetermined time, determined by a fixed test capacitor inserted in terminals 13, 14. It is also possible thereby to calibrate the internal capacitor 20, or resistor 22, respectively, by rapidly inserting and removing a standard test component into the respective connecting prongs with a predetermined setting of the respective component 20 or 22, as set on the scale 21, 23, respectively.

The test circuit 200 is shown as including a capacitor 20. Rather than using a capacitor, an inductance can be placed therein, or an additional switch connected in the circuit to selectively test for an inductance, a capacitor, or a resistor. The test conditions will be similar, and current rise, or decay, respectively, upon connection and disconnection of a coil can be checked. Switch 8 then, preferably, is to be constructed as a three-way switch with an additional terminal for connection of a coil of variable inductance, selectively, and having a terminal connected in parallel to capacitor 20. Alternatively, an inductance can be connected to terminals 13, 14, thus automatically disconnecting the capacitor 20. The inductance may be a separate variable inductance having its own calibration setting.

(2) To check a resistor connected between terminals 1, 2, C/R switch is changed over to place it in the terminal position b. The following circuit will then be established: Positive terminal + of battery 39, connections 6, 4, connection 2, through the test resistor to connection 5, over closed switch 9, resistor 19, T/S switch 8a, and terminals 3, 5 of acoustic tester 100. The pitch of the tone from transducer 38 will depend on the resistance of the test resistor connected between terminals 1, 2. If the resistance of the test resistor is so high, however, that the current flowing therethrough is insufficient to cause the multivibrator to operate, then a d-c source can be connected serially in the test circuit, that is, connected in series with battery 39 to provide sufficient operating current. Otherwise, failure of the transducer to provide an output will be an indication of excessive resistance.

Upon operation of the T/S switch 7, 8 to the position not shown in the drawings, that is, to change the terminals to 7b, 8b, the following circuit will obtain: Positive terminal (+) of battery 39, connections 6, 4, resistor 22, through closed switch 15, 7b, 11b, resistor 18, and terminals 3, 5. The test resistor is disconnected from the test circuit. The resistance of resistor 22 can be changed continuously or in steps, depending on its construction, and the resistance value read on a scale 23. Repeated operation of the T/S switch and change of the resistance of resistor 22 can then be used to obtain equality of tone regardless of the T/S switch position, and the value of the resistance connected between terminals 1, 2 can then be judged by reading from the scale 23.

Scale 23 may indicate any suitable unit, for example temperature, if the resistance of the test element changes with temperature; the resistance which is set on the resistor 22 need not be the same as that indicated on the scale if an additional voltage source is inserted into the test circuit, and an additional "external source" scale can be provided. It is also possible to subdivide the scale into voltage or current values. Terminals 16, 17 can be used to insert an external resistor in the standard circuit rather than resistor 22, the external resistor then disconnecting resistor 22 over the switch 15.

The external standard can be a resistor or any suitable network which consists of a passive or an active two-terminal element, of either fixed or variable value. In any case, the external standard can be used to compare the circuit action of the external standard with the circuit action of a test element connected between terminals 1, 2 by comparing the pitch of the tone from the transducer 38 in the tester 100.

(3) To test networks for voltages, whether a-c, d-c, and, if d-c polarity:

The multifunction testing circuit 200 is subdivided into two sections, section 201 to test coils, capacitors, resistors, and the like, and a section 202 which can test networks. The network section 202 is not strictly necessary and, if not desired, can be omitted, in which case the output terminals of the testing circuit 200 will be terminals 1', 2'. If the network section 202 is used, a network/component switch having switching sections 9, 10 is used to selectively place the network section in circuit with the testing circuit, or not.

Quantitative testing of d-c and a-c voltages uses the network section 202 which includes a series circuit formed of resistor 24 and diode 25, bridged by the switching section 9, and a cross-connected capacitor 26, selectively connectable by switching section 10 between the junction of the resistor 24 and diode 25 and the other connecting line from the tester 100. The switches as shown in FIG. 1 are in the position to test for external voltages. Change-over of the network-/component (N/C) switch closes section 9 and opens section 10. The resistance of resistor 24 is so selected that the multivibrator does not respond when the circuit is connected, or responds beyonds its region of proportionality if terminals 1, 2 are connected to an external network having low resistance, or no resistance.

If the terminals 1, 2 are connected to a source of voltage then, in dependence on the nature of the voltage source, various reactions to the circuit will result: (a) if the voltage is a d-c source, capacitor 26 will charge and form, as charged, a source of d-c for the tester 100. The following circuit will result: Positive terminal of battery 39, connections 6, 4, switch 10, to the negative side of capacitor 26, from the positive terminal thereof over resistor 24, resistor 19, T/S switch 8a to terminals 3, 5 of tester 100. If the capacitor 26 continues to be recharged from the voltage source which is connected to the terminals 1, 2 through diode 25, current through the resistors 24, 19 will not drop, and the transducer 38 will provide a continuous tone. (b) If the d-c voltage is reversely poled with respect to the diode 25, the capacitor 26 will not be charged, and when the T/S switch is in the "test" position, that is, terminal 8a closed and terminal 7a open, the tester 100 will be silent or operate as controlled by the R/C circuit formed by the resistor capacitor network 24, 26, depending on the value of the resistor 24 and of the capacitance of capacitor 26. (c) If the outside source is alternating, then the tone derived from transducer 38 will differ, since only half-waves will be rectified by diode 25 or, if the frequency is low enough to be audible as variations in amplitude and/or pitch of the transducer 38, a judgment as to the frequency of the outside alternating source can be made.

The output from transducer 38 can be compared with a standard, as before, by operating the T/S switch 7, 8 and, if desired, also C/R switch 11. In most instances it will be simpler to also operate the C/R switch and adjust the value of the resistor 22 for comparison purposes. The scale 23 can then be numbered to indicate, for example, voltage values.

Figure 2:
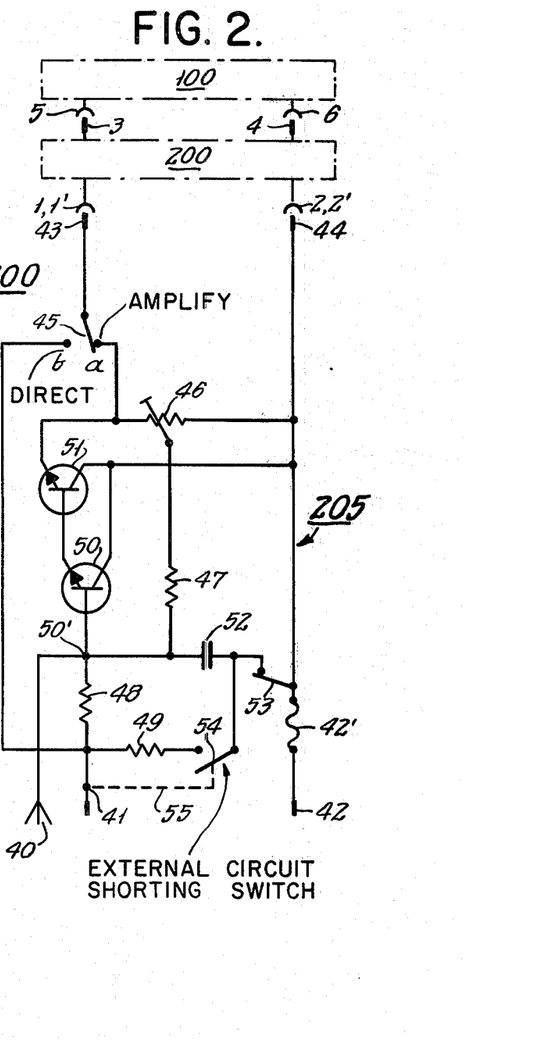
FIG. 2 is a block diagram of an attachment, or additional circuit portion to permit additional testing functions to be carried out.

Embodiment of FIG. 2: The additional circuit 205 of FIG. 2, which may be connected to output terminals 1, 2, or terminals 1', 2' of the multifunction circuit 200, respectively, if comparison values are desired, is particularly suitable to check the value of capacitors of low capacity, or to determine insulation resistances which, normally, have a resistance value which is higher than the highest resistance which can be introduced in the circuit of FIG. 1 and still obtain a useful output from the transducer 38. Additionally, the system of FIG. 2 which includes an amplifier can be used to detect the presence of external electrical fields, for example R/F fields, or other alternating fields.

The circuit of FIG. 2 has external, final output terminals 41, 42, preferably with a fuse link 42' interposed. The input terminals 43, 44 are preferably connected to terminals 1, 2, or 1', 2' of FIG. 1, but may be connected directly to the tester output terminals 5, 6 of the tester 100 if qualitative testing, that is, tone comparison of external components or parameters with the tone derived from a standard is not needed. In a preferred form, the additional unit 205 will have test prongs 43, 44 which can be directly connected into terminals 1, 2, or 1', 2', and the unit itself can be integral with the test prongs so that the unit 205 can be fitted on the unit 200 as an external additional attachment which is directly connectable with the unit 200. Desirably, the terminals 3, 4 are similar to the terminals 43, 44, and the terminals 5, 6 similar to the terminals 1, 2 so that, alternatively, the unit 205 can be directly connected to the terminals 5, 6, if desired.

A transistor amplifier, including a pair of transistors 50, 51 connected in a Darlington circuit, with a base resistor 47 connected to a control junction 50' of the Darlington input transistor 50, has its other terminal connected to a slider of a potentiometer 46, forming a voltage divider. The resistance value across the outside terminals of resistor 46 are above that which permits oscillation of the tester 100 if terminals 43, 44 are directly connected to terminals 5, 6. Resistor 48 is provided to limit base current. Resistor 49, in combination with a switch 54, is used to discharge capacitors in the test circuit connected to the final output terminals 41, 42. Capacitor 52 is a high-frequency bypass capacitor, and prevents the influence of stray electromagnetic fields on the test circuit, for example high-frequency fields which may be picked up by connecting wires. Switch 53, when open, makes the circuit sensitive to high-frequency fields which can be picked up by an antenna 40, so that the system can be used to check for ambient electromagnetic fields.

The switch 45 is provided to place the amplifier 50, 51 in circuit, or to disconnect the amplifier when in the position 45b (not shown in FIG. 2). When in the position 45b, a direct connection is provided between terminals 43 and final output terminals 41. In a preferred form, terminal 41 is a movably mounted terminal which, when pressure is applied thereto, closes a switch. This switch is switch 54. The mechanical connection between the prong 41 and switch 54 is schematically indicated by broken line 55.

Test steps, unit 205, FIG. 2:

(1) Quantitative test of capacitors: The following circuit will be established: From positive terminal (+) of the battery 39 of tester 100, terminals 6, 4, 2, 44 to voltage divider 46; through the voltage divider 46, through the amplify/direct switch 45, terminal 45a as shown in FIG. 2, terminals 43, 1, 1', 3, 5 of tester 100. Due to the high resistance of voltage divider 46, the multivibrator of tester 100 will not be operative, and no current will flow through transistor 36 (FIG. 1) since the base thereof, connected through resistor 32, will have a voltage appear thereon which is more positive than the emitter voltage. The voltage tapped off the voltage divider 46 is applied to the control junction 50' through the resistor 47 which will have a voltage only so much more positive with respect to that of the emitter that the current flowing as a consequence thereof through the transistor 36 (FIG. 1) is increased to an extent at which the multivibrator circuit therein still is quiescent, that is, that the transistors are just below the operative level. If a capacitor is connected to the final output terminals 41, 42, a charge circuit will be established from the positive terminal of the battery in tester 100 over the connections: 6, 4, 2, 44, 42 to one terminal of the capacitor; and from the other over the connection 41, resistors 48, 47 to the tap point or slider of the voltage divider 46. Resistor 48, which is an emitter resistor, is substantially smaller than the resistor 47 so that the voltage applied at the control junction 50' and to the base of the transistor 50 is strongly shifted in positive direction, and transistor 50 will become conductive. Thus, transistor 51 will become conductive and a low-resistance path will be formed in parallel to voltage divider 16. This permits current through the transistor 36 (FIG. 1) of the tester 100 to exceed the value at which the multivibrator circuit therein becomes oscillatory. Transducer 38 (FIG. 1) of the tester 100 will provide a tone. As the charge at the final output terminals 41, 42 increases, the voltage on the base of transistor 50' and hence current through the transistor 51 will drop, and current between the terminals 5, 6 will decrease until it has passed that level at which the multivibrator can function, and hence the multivibrator will cut off. With decreasing current, the tone derived from the transducer 38 will change in frequency and in amplitude. Finally, the transducer 38 will be silent, indicating end of charging of the capacitor connected to the terminals 41, 42.

(2) Qualitative test of external capacitor: A capacitor, tested as described under (2) above, can be checked for value with a standard in the multifunction testing circuit 200 by suitably numbering the scale 21 or 23. A capacity value set in capacitor 20 will not be similar to the capacity of a capacitor checked across terminals 41, 42, if the terminals 43, 44 are connected to the outputs 1, 2 of FIG. 1 and not provide the same tone due to the presence of the amplifier 50, 51 in the circuit 205 of FIG. 2. Thus, the scale must either be provided with a conversion factor, or a separately calibrated scale is to be used.

(3) Testing of external networks: If an external network of very high resistance, or a very high resistor is connected to output terminals 1, 2 (FIG. 1), there will be insufficient current flowing to the transistor 36 of the tester 100 to cause the system to operate. A similar high resistance or resistor connected to final output terminals 41, 42 of the amplifier unit 205 (FIG. 2) can still, however, cause the oscillator to operate. The upper limit of operation will depend on the value of the resistors 47, 48 but can be additionally set by means of the slider of the voltage divider potentiometer 46.

(4) Checking for external voltages: Connecting a voltage source to terminals 41, 42 provides a tone from the tester 100 if the voltage at terminal 41 is positive with respect to that at terminal 42. Alternating current voltages will provide modulation of the tone emitted from the tester 100 with the frequency of the alternating current. Thus, it is possible to provide an audible output representative of the frequency of alternating voltage sources; with only little experience, it is possible for a human observer or user to distinguish between various frequencies of modulation.

(5) Checking for ambient electromagnetic fields: Antenna 40, when placed into an electromagnetic field of sufficient intensity for response, places the control junction 50' of the amplifier 50, 51 at a voltage causing the amplifier to operate. If the field is of sufficient intensity, transistor 50 will be controlled to be conductive at positive half-waves of the field, and thus permit the multivibrator in tester 100 to respond in the rhythm of the oscillations. If the oscillations are of radio frequency level, a continuous output can be obtained. The loudspeaker 38 will then provide a tone modulated in accordance with the frequency of the alternating field which may be so low as to be audible, or may well be supersonic, or of radio frequency level. Alternating potentials applied to control junction 50' from antenna 40 are bypassed by capacitor 52 to an increasing extent as the frequency increases. Opening switch 53 renders control junction 50', and hence antenna 40, sensitive to high-frequency signals, since capacitor 52 which acted as a bypass is out-of-circuit. A greater proportion of the field voltage will become effective and the entire circuit will be sensitive. Under conditions of checking for components or networks which should not be influenced by ambient fields, the switch 53 should be closed.

Resistor 49, placed in circuit by the probe operated switch 54, is a shorting resistor to discharge any capacitor in the test circuit. Its function is similar to resistor 19, FIG. 1. The resistor 49 is used to discharge the capacitor before test, and, after charging of the capacitor, during the test, to then discharge it again so it will be released from the test in discharged condition. When switch 54 is closed, resistor 49 is placed in parallel with test terminals 41, 42 through the closed switch 53. The switch 54 is operated, that is, is closed when the test prong 41 is pressed against the terminal of the test capacitor, overcoming a spring force inherent in the test probe. Upon release of the spring force, switch 54 will open, thus permitting testing of the capacitor. The resistor also protects the circuit against potentially harmful voltages to which an unknown test capacitor may have been charged.

Figure 3:
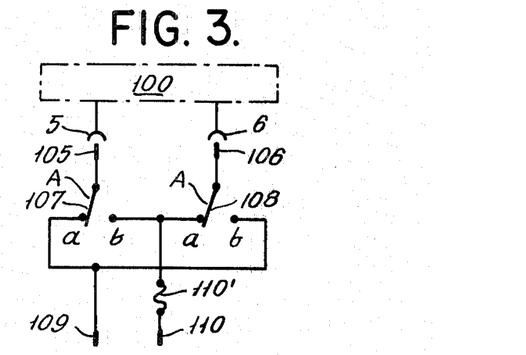
FIG. 3 is a simplified block diagram illustrating one form of a rapid-changeover test switch.

FIG. 3: The circuit is a particularly simple test-standard comparator switch which can be used either with terminals 5, 6, 1, 2, or 1',2', as desired. The tester 100 with its connections 5, 6 is connected to input terminals 105, 106 which are connected to change-over switching terminals of switches 107, 108. The switches are held in the position shown to engage contacts a as seen in FIG. 3, by spring force schematically indicated by arrow A. Switches 107, 108 are not ganged together but can be separately operated, to change over either switch 107, 108, or both, to the position shown at b. The output from the circuit is taken at terminals 109, 110, preferably with a fuse link 110' interposed.

Operation: Let it be assumed that the circuit is connected to output terminals 5, 6 of tester 100, as shown. A network or an element to be checked is connected to terminals 109, 110. If the element or network is of such value that the test circuit of the multivibrator in tester 100 is thereby closed, transducer 38 (FIG. 1) will provide a tone. Upon moving one only of the switches 107 or 108 in the other position so that it engages terminal b, then the connection to the external testing circuit or component between the terminals 109, 110 is interrupted and an internal circuit will be established between the terminals 5, 6 of the tester, 100, directly extending, for example, from terminal 5 over connector 105, switch 107b, switch 108a, to terminal 106 and hence to tester output terminal 6. A tone will be derived from the transducer of the tester, the frequency of which will correspond to that of a short-circuited terminal 5, 6. The tone will, therefore, represent a resistance between the terminals 5, 6, which is a minimum, assumed to be practically zero ohms—neglecting contact and connection resistances. These resistances can be assumed to be constant and unvarying during the time of a test, and are determined by the quality of construction and the components used. The tone can be used as a reference level in order to provide a judgment reference if an external circuit or network or component is connected to terminals 109, 110. With a little practice, it is possible for a human operator to distinguish between four reactions of the tester 100 and to be able to provide corresponding qualitative information regarding the nature of an unknown component or network, usually referred to as a "black box" connected to the terminals 109, 110.

(1) If the tone does not change upon operation of one of the switches 107 or 108, then the "black box" is of low, practically zero resistance.

(2) If the tone is present only if the switches 107, 108 are not operated, a resistance which is higher than the highest resistance of response of the tester 100 is present. This highest resistance may be indicated on the tester 100, and is governed by the design thereof, and specifically by the components of the C/R circuit 31–33, 34, 35, the value of the battery 9, and the types of transistors used. This is a matter of design.

(3) If a tone is derived from the tester 100 which, however, differs in pitch substantially from that of the tone when only one of the switches 107 is operated, then resistance value intermediate between zero and the maximum response characteristic is present. Various ranges of such resistance values, at least two besides zero resistance, can readily be distinguished by a human observer, and frequently more resistances can be distinguished. Comparison with a standard, for example previously tested with the unit 201 (FIG. 1), can then provide a judgment.

(4) If both switches 107, 108 are simultaneously operated, that is, changed over to the b position, then the polarity of the externally connected terminals 109, 110 will be reversed. If the external "black box" was a discharge capacitor applied to the terminals then, for the duration of its charge, the multivibrator of the tester 100 will oscillate, and the circuit will function similarly to the circuit 200, (FIG. 1), and provide a tone from the transducer 38 during the charge period of the capacitor. Likewise, a charge capacitor can be so connected to the test terminals that its charge voltage is additive with respect to that of the battery 39 (FIG. 1), the tone being audible for a longer period of time, since the previously present charge must be dissipated in addition to the charge provided by the voltage source 39, before the capacitor can be recharged to the opposite polarity. Thus, if a capacitor is connected to the terminals 109, 110 then, upon simultaneous operation of the switches 107, 108, it is first discharged and then recharged in the opposite polarity. The tone from transducer 38 will thus be twice as long as that which is derived from a discharge capacitor. Thus, it is possible for the operator to determine—by evaluating the duration of the tone, for example by counting, what the capacity of the connected capacitor is. This capacitor, for example, may be represented by an open-circuited power line. With a little experience, it is possible to provide even with this coarse instrument a quantitative evaluation which is somewhat better and more easily determined than the testing of resistors. Thus, the simultaneous operation of the two switches 107, 108, in effect providing for double pole-double throw operation, provides for simple quantitative analysis of capacitors.

(5) The system of FIG. 3 is also particularly useful to test diodes, since their polarity terminals can then readily be determined, that is, if the diode is connected in conductive direction, a tone will be derived from the transducer 38, but no tone if in blocking direction.

FIG. 3 shows the connection of the transfer switching system to the tester output terminals 5, 6; it can be used with terminals 1, 2, or terminals 1', 2', FIG. 1, in which case switch 7, 8 should be set or locked in "standard" position, that is, in the position where the switches 7, 8 engage terminal b. The circuit of FIG. 3 can also be interposed between terminals 5 & 3 and 6 & 4 of FIG. 1.

Figure 4:
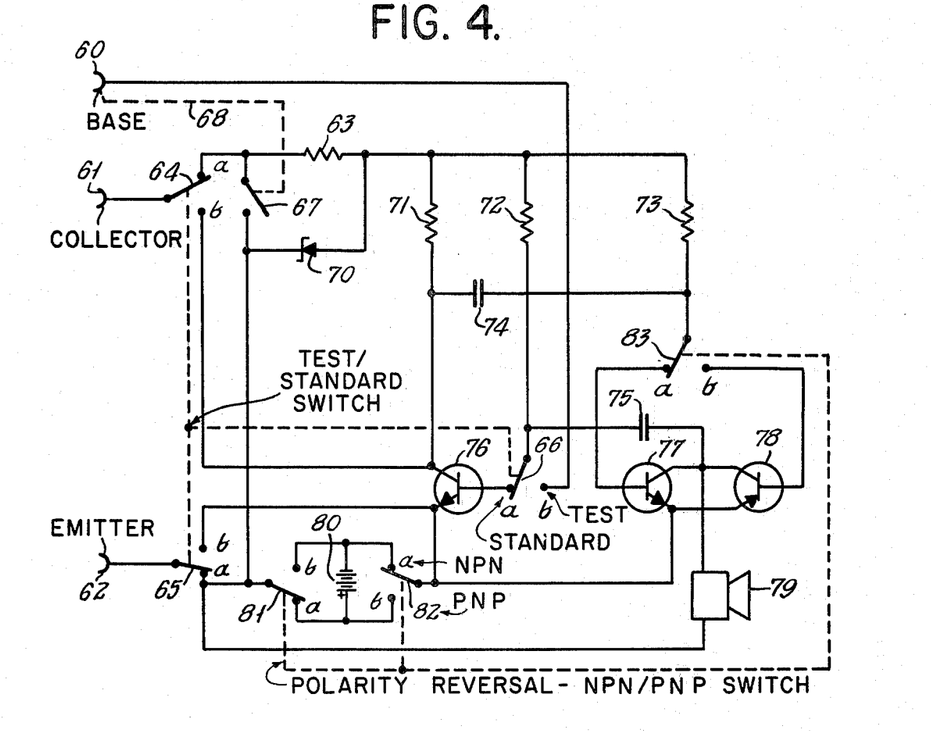
FIG. 4 is a simplified circuit diagram illustrating one form of a transistor tester, and using basically the same circuit diagram as the acoustic output tester of FIG. 1.

Embodiment of FIG. 4, to test transistors: The tester can also be used to test transistors which are at least roughly similar to transistors 36, 37 (FIG. 1). The transistors 76 and 77, 78 correspond, esssentially, to transistors 36, 37 of FIG. 1, with transistor 76 having the same function as transistor 36, and either of transistor 77, or 78 having essentially the same function as transistor 37 (FIG. 1).

In ordinary operation as a tester, the npn transistors 76, 77 operate in the well-known multivibrator circuit, including resistors 71, 72, 73 and capacitors 74, 75—see also FIG. 1. Battery 80 supplies power, and the test circuit can be connected to terminals 61, 62, with the switches in the position as shown. The loudspeaker or other transducer 79 will then provide a tone if the resistors are suitably chosen. Thus, terminals 61, 62 of the circuit of FIG. 4 correspond, essentially, to terminals 5, 6 of the acoustic output electrical tester 100 of FIG. 1.

To test an external transistor, not shown, with respect to its operation, the collector is connected to terminal 61, the emitter to terminal 62, and the base to terminal 60. Terminal 60 is connected to a switch 67, preferably by a coupling to the terminal so that the switch 67 will close if the test prong is inserted into terminal 60. To test an external transistor, the test/standard (T/S) switch having elements 64, 65, 66 is operated so that the switching terminals will change over from terminal a to the position engaging terminal b.

Operation, and circuits to test an npn transistor: Upon closing of switch 67, that is, upon engagement of the base terminal 60, a circuit is established from the common line of the resistors 71, 72, 37 over resistor 63 through the closed switch 67 and to battery 80. This connection replaces the circuit which is otherwise present in the tester, and the multivibrator will operate as before, the loudspeaker providing a tone. The closing of switch 67, thus, effectively, internally presents a circuit otherwise established by a load, or test element connected between terminals 61, 62.

To test the transistor which is externally connected to the external terminals 60, 61, 62, the T/S switch sections 64, 65, 66 are changed over to the position of b, so that the transistor 76 will block since its base is separated by the section 66 from the circuit. Instead of transistor 76, however, the respective electrodes of an external resistor are placed at the corresponding connection points of the multivibrator circuit. If this is a npn transistor which is properly functioning, then the multivibrator will operate as before and a tone will be provided from transducer 79. If no tone is available, then either the external transistor is inoperative or it is a pnp transistor.

Checking a pnp transistor: The polarity reversal-npn/pnp switch having switching sections 81, 82, 83 is operated and changed over from the terminal positions a as shown, arranged to test for an npn transistor to the terminal position b to check for a pnp transistor. The switching sections 81, 82 reverse the polarity connection of battery 80, and the switch 83 disconnects the base of the npn transistor 77, thereby blocking the npn transistor 77. In its stead, the base of the pnp transistor 78 is connected to the resistor 73 and capacitor 74, so that the pnp transistor 78 is placed in circuit. If the outside externally connected transistor is of the pnp type, then the multivibrator will operate as before and the loudspeaker will provide a tone. If no tone is obtained, then either the external transistor is inoperative, or it is not a pnp transistor, or of a type so vastly different from those used in the multivibrator that it is inoperative in the circuit.

The resistors, or any one of them, 71, 72, 73, and/or the capacitors, or one of them, 74, 75, may be made to be adjustable, either continuously or in steps, or otherwise variable, to permit matching of components and operation of the circuit as a multivibrator, even if the external transistor, of unknown characteristics, should differ from the general type of the transistors used in the tester.

Figure 5:
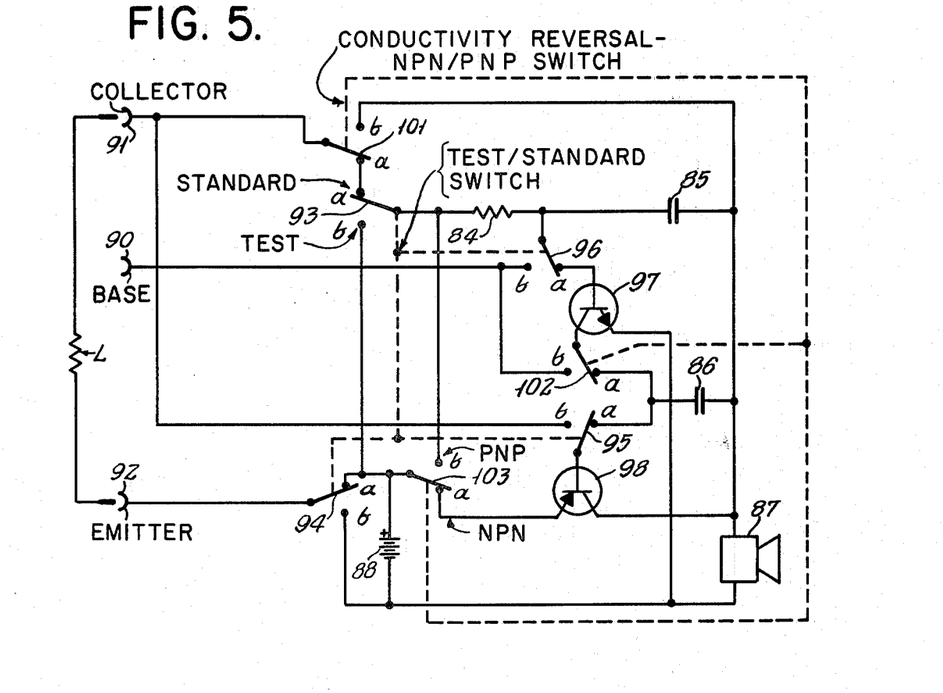
FIG. 5 is another embodiment of a transistor tester and using a modified circuit arrangement.

Embodiment of FIG. 5: The transistor tester of FIG. 5 differs from that of FIG. 4 in that two complementary transistors are used in the multivibrator circuit, but so connected that either one can be selectively replaced by an external test transistor, in order to again permit testing or transistors of both types. The multivibrator circuit has an npn transistor 97 and a pnp transistor 98 connected in a multivibrator circuit having a resistor 84 and capacitors 85, 86. To use this multivibrator, the circuit of which, inherently, is known, as an acoustic output tester, external terminals 91, 92 can be connected to resistance or other impedance loads. The tester of FIG. 5 will then function essentially similar to the tester 100, FIG. 1, and terminals 91, 92 will correspond to output terminals 5, 6, FIG. 1, or to terminals 61, 62, FIG. 4, respectively. A tone will be provided from output transducer 87, which may be a loudspeaker or earphones, if the battery 88 is connected as shown and a connection, for example a load L, shown as a resistor is connected across external terminals 91, 92. All the switches and switch sections shown in FIG. 5 will be in the position shown. The tester of FIG. 5 has a test/standard (T/S) switch having switching sections 93, 94, 95, 96 and a conductivity reversal-npn/pnp switch having sections 101, 102, 103.

Operation, to test an external npn transistor: An external transistor can be connected with its base to external terminal 90, its collector and emitter to terminals 91, 92. The T/S switch with sections 93, 94, 95, 96 is then operated to change the tester over the position b. The transistor 97 is then blocked since the base thereof is isolated by the switch section 96, and additionally the connection from the collector thereof to the base of transistor 98 is interrupted by the switch section 95. If the external npn transistor is operative and reasonably matches the internal transistor 97, a tone will be obtained from the transducer 87, since the transistor 97, effectively, has been replaced by the external transistor. The switch 93b will provide a direct connection from the resistor 84 to the positive terminal of battery 88. If no tone is obtained, then either the transistor is inoperative, differs widely from a type which can be matched to the transistor 97, or is of the pnp type.

To test for a pnp transistor: The npn/pnp switch is changed over, the T/S switch remaining in the b position. The switch section 102 disconnects the base of transistor 90 and, rather, connects the external base terminal 90 in circuit with the resistor 84 and capacitor 85. Switch section 103 provides a connection to the positive terminal of battery 88 and isolates the emitter of transistor 98. Instead of transistor 98, the external terminals 90, 91, 92, and hence the transistor connected thereto, are placed in the circuit. If, with both the T/S switch operated and the conductivity reversal switch operated, a tone is obtained, then an external pnp transistor is operative; if no tone is obtained, then either it is not a pnp transistor, or it is inoperative, or varies widely from a transistor which can be used in this circuit.

In a typical operating example, the circuit of FIG. 1 has the following values:

resistors 31, 32, 33: 1.2 kΩ, 68 kΩ, 6.8kΩ
capacitors 34, 35: 33 nF, 6.8nF
transistors 36, 37: each BC 168C
battery voltage 39: 4.5 V
resistor 18, 19: each 100 Ω
capacitor 20: 1–1000 μF
resistor 22: 10 kΩ
resistor 24: 47 kΩ
capacitor 26: 1 μF In the circuit of FIG. 5,
resistor 84: 150 kΩ
capacitors 85, 86: each 10 nF
battery 88: 4.5 V Various changes and modifications may be made, and features described in connection with any one of the embodiments may be used with any of the others, within the scope of the inventive concept. For example, the multi-function testing circuit 200 (FIG. 1), using either both sect 201, 202, and with or without the additional amplifying section 205 (FIG. 2), with or without the switch-over circuit of FIG. 3, can be connected to either terminal 61, 62 of the tester of FIG. 4, or to terminals 91, 92 of the transistor tester of FIG. 5. Thus, and particularly by use of a basic tester circuit which permits external connection, and selective interconnection thereof to an external transistor, a versatile test instrument is provided which does not require visual observation of an output indication of a scale, thus detraction concentration of the user from test prongs or test probes connected in a circuit or to components to be tested and which frequently are accessible only with care and close attention. Diodes and various two-terminal elements can also be tested by using the component test section 202 of FIG. 1; for example if a diode is reversely connected to terminals 1, 2, the tester 100 should be silent. If, however, a tone is obtained, this is an indication that it is leaky or short-circuited. The pitch of the tone, and its intensity, can be used to provide a judgement of the degree of reverse conduction of the diode.

The apparatus, therefore, is available to test various components and network parameters, and particularly to test networks for voltage, resistance, or capacitance, which may be direct electrical parameters, or may be transduced parameters, such as humidity, temperature, or transduced from other external or ambient conditions. The system is simple, inexpensive, and places little requirement on tolerance of components with respect to temperature or voltage. Overall, the construction of an acoustic output electrical tester and/or the multi-function testing circuit, and using the testing circuit in combination with the acoustic tester, is less costly than a similar optical instrument, given the same degree of output reliability and discrimination for the user between values or parameters to be indicated. The multi-function testing circuit section 201, which can contain its own internal standard, can permit comparison with standards without optical observation of the system, which is particularly important when working in environments which are difficult to reach, or accessible only with extreme care and caution, or under power or other high-voltage conditions. The entire attention of the user can be directed to the placement of the probes connected, for example, to terminals 1, 2 (FIG. 1) and not to an indicating scale.

I claim:

1. Multi-function test apparatus to test, selectively and as desired, electrical circuits and circuit components comprising the combination of
   an acoustic output electrical tester (100) and a multi-function testing circuit (200) therefor,
   wherein said acoustic output electrical tester (100) comprises
   a local power source (39);
   an a-c - audible signal transducer (38);
   a multivibrator oscillator circuit having at least two transistors (36, 37) and R/C networks (31, 32, 33, 34, 35) interconnecting said transistors and said local power source (39) in a positive feedback oscillatory circuit, at least a portion of said R/C circuit and at least one of the transistors forming a frequency determining circuit to provide, upon energization by said source, an output tone from said transducer of predetermined pitch or frequency;
   and tester output terminals (5, 6) connected across at least a portion of said frequency determining circuit to modify the frequency of oscillation of said multivibrator circuit and hence the pitch of the tone reproduced by the transducer upon connection of impedances to said test terminals;
   and wherein, in accordance with the invention,
   the multi-function testing circuit (200) comprises
   input terminals (3, 4) connectable with the acoustic tester output terminals (5, 6);
   output terminals (1', 1; 2', 2) selectively connectable with a circuit or electrical circuit component to be tested;
   a resistance standard circuit (22; 15, 16, 17);
   a reactive impedance standard circuit (20; 12, 13, 14);
   an impedance-resistance selector switch (11) selectively settable to test resistance components or reactive impedance components;
   a test-standard transfer switch means (7, 8) having switch terminals connected to at least one (1) of the output terminals (1, 2), at least one (3) of the input terminals (3, 4) and selectively connecting the resistance standard circuit, or the impedance standard circuit, as selected by said impedance-resistance selector switch (11) to permit establishing when said test-standard transfer switch means is
   (a) in the "standard" position, a closed circuit from the input terminals through the selected standard circuit while disconnecting the output terminals and cause generation of a tone in the transducer (38) of the tester (100); and when
   (b) in the "test" position, a closed circuit from the input terminals (3, 4) to the output terminals (1', 1; 2', 2), and thus permit comparison of the pitch of the tone from the transducer (38) of the tester (100) as the transfer switch is operated, and hence a judgment of deviation of the tone from the transducer when the connection is changed, respectively, between the standard circuit and a test component connected to the output terminals.

2. Combination according to claim 1, wherein at least one of the standard circuits comprises an adjustable element (20, 22) to permit, selectively, generation of tones of selected pitch to form standard tones for comparison.

3. Combination according to claim 1, wherein the resistance standard circuit includes an adjustable resistor (22) (22).

4. Combination according to claim 3, further including external standard connection means (16, 17) connected in circuit with said resistance standard circuit to permit connection of an external standard resistor therein.

5. Combination according to claim 1, wherein said reactive impedance standard circuit includes an adjustable capacitor (20) means.

6. Combination according to claim 5, further including external standard connection means (13, 14) connected in circuit with said impedance standard circuit to permit connection of an external standard capacitor therein.

7. Combination according to claim 1, wherein at least one of said standard circuits includes
an internal standard impedance element (20, 22);
external standard connection means (13, 14; 16, 17) to permit connection of an external standard impedance element;
and switch means (12, 15) connecting said external standard connection means in lieu of the internal standard impedance element into the respective standard circuit to permit replacement of the internal element by the external element.

8. Combination according to claim 1, wherein the impedance standard circuit (20; 12, 13, 14) includes a network resistance (18) which is connected to the test-standard transfer switch means (7, 8) and in circuit with the input terminals (3, 4) when said test-standard transfer switch is in the "standard" position to provide an R/C circuit across said input terminals (3, 4) of known, predetermined value;
and a comparison resistor (19) of a value matched to the resistance value of said network resistor (18) connected to the test-standard transfer switch means (7, 8) and in circuit with the output terminals (1, 2) when said test-standard transfer switch is in the "test" position to provide an R/C circuit which has a reflected resistance appearing at the input terminals (3, 4) which matches the resistance of the reactive impedance standard circuit.

9. Combination according to claim 1, wherein the multi-function testing circuit (200) includes
a network test section (202) comprising
a diode component (25) in series with one (1) of the output terminals;
an R/C network (24, 26) having resistance and capacitance components (24, 26), in series/parallel connection with said output terminals (1, 2);
a network test switch means (9, 10) shunting components of said network test section (202) and connected serially with said output terminals (1, 2) and disconnecting components connected across said output terminals to disable circuit effects of said components (24, 25, 26) when the testing circuit is used for component testing by means of said impedance-resistor selector switch (11), and to place the components of said network test section (202) in circuit with the input terminals to permit connection of an external voltage carrying circuit to said input terminal (1, 2).

10. Combination according to claim 9, wherein the R/C network (24, 26) includes a resistor (24) connected in series with the diode (25) and a capacitor (26) connected between the junction of the resistor (24) and the diode (25) and to the output terminal (2) not connected to the diode, so that the resistor-capacitor combination will form an R/C network connected across the input terminals (1, 2),
the resistor (24) having a resistance value sufficient to inhibit oscillation of the multivibrator oscillator circuit of the acoustic output tester (100) unless an additional external voltage or negative impedance is connected to said input terminals, whereby the nature of external voltages, whether a-c or d-c, and if d-c, their polarity, can be deduced from the absence of tone, presence of tone, or its pitch derived from the transducer (38) of the tester (100).

11. Combination according to claim 1, wherein the output terminals (1', 2') of said multi-function testing circuit (200) form intermediate outputs;
and wherein the multi-function testing circuit includes (FIG. 2) an amplifier section (205) having a control amplifier (50, 51) and connected to the intermediate outputs (1', 2'),
a voltage divider (46) connected across the intermediate outputs (1', 2');
means (47) connecting a voltage taken off a tap from the voltage divider to a control junction (50') of the amplifier to control the amplification thereof;
final output terminals (41, 42) connectable to external electrical means;
and coupling means (42', 48, 52) connecting the final output terminals (41, 42) to the control junction (50') of the amplifier to control the amplification of said amplifier as a function of the electrical circuit parameters of the external electrical means.

12. Combination according to claim 11, wherein the voltage divider has a maximum resistance which is large enough to inhibit oscillation of the multivibrator oscillator in the tester (100) in the absence of an external electrical means lowering the resistance reflected to the tester output terminals (5, 6) of the acoustic output tester (100).

13. Combination according to claim 11, wherein the voltage divider has a maximum resistance which is large enough to inhibit oscillation of the multivibrator oscillator in the tester (100) in the absence of an electrical means connected to said final output terminals (41, 42) and controlling said controlled amplifier (50, 51) to reflect a lesser resistance to the tester output terminals (5, 6) of the acoustic output tester (100).

14. Combination according to claim 11, further including electrical field pick-up means (40) connectable to said control junction (50') to control said controlled amplifier to amplify said signals and reflect an impedance to said tester output terminals (5, 6) of the acoustic output tester (100) which is of a magnitude to cause the tester to go into oscillation.

15. Combination according to claim 14, further including a switchable radio frequency bypass capacitor (52, 53) in circuit with the field pick-up means (40) and selectively preventing application of control voltages derived from said field pick-up means (40) to said control junction (50').

16. Combination according to claim 11, further including a switchable shunting resistor (49–54) in circuit with said final output terminals (41, 42) and providing, selectively, a dissipating path across said final output terminals to discharge a test capacitor placed across said final output terminals.

17. Combination according to claim 16, wherein at least one of said final output terminals is a switching terminal which, upon application of engaging connecting pressure thereto, connects said switchable shunting resistor (49) in circuit across the output terminals.

18. Combination according to claim 1, further comprising a polarity reversible and rapid changeover standard-test switching circuit (FIG. 3) having
two output connections (109, 110);
two individually, separately operable spring loaded single pole-double throw switches (107, 108);
connection means (105, 106) connecting the changeover terminals of each of said switches to the tester output terminals (5, 6);
a first one each of the switching terminals (107a, 108a) being connected directly to a respective output connection (107a-109; 108a-110), the other switching terminals (107b, 108b) being connected to said output connections (109, 110) with the allocation of respective switching terminals and output connections being interchanged (107b-110; 108b-109) with respect to said direct connection, whereby
(a) operation of one only of said individually operable switches will establish circuits selectively
(1) through both said switches, a direct connection between the tester output terminals (5, 6) so that the tester will oscillate at its inherent frequency of oscillation or
(2) though both said switches, to the two output connections (109, 110);
(b) operation of both said individually operable switches will reverse the polarity of the respective connections between said two output connections (109, 110) and the connection means (105, 106) and hence the tester output terminals (5, 6).

19. Combination according to claim 18, further including a circuit protective fuse link (110') connected between at least one of the switching terminals and one of the output connections (109, 110).

20. Combination according to claim 1, for testing of transistors (FIGS. 4, 5) further including
externally accessible test terminals (60, 90, base; 61, 91, collector; 62, 92, emitter);
tester switch means (64, 65, 66; 93, 94, 95) providing a plurality of changeover switching functions connected to said R/C networks (31-34; 71-74; 84-86), to at least one of the transistors (76; 97, 98) of the multivibrator oscillator and to said externally accessible test terminals, and selectively connecting said R/C networks to respective electrodes of said at least one transistor, or the respective externally accessible test terminals,
whereby a transistor to be tested can be connected to said externally accessible terminals and take the place of said at least one transistor of the multivibrator oscillator circuit, and the behavior of the oscillator circuit will permit judgement regarding said transistor to be tested.

21. Combination according to claim 20, further comprising (FIG. 4) a polarity reversal switch (81, 82, 83; NPN-PNP) connected to said local power source (80);
and wherein said multivibrator oscillator circuit of the accoustic output tester (100) has a first transistor (76) of a first conductivity type (NPN) and paired second and third transistors (77, 78) of respectively different conductivity types (77: NPN; 78: PNP);
said tester switch means (64, 65, 66) being connected to said first transistor (76),
the first transistor having a first function in said circuit and each of the paired transistors having another function in said circuit, said first transistor being connected to both of the paired second and third transistors;
said polarity reversal switch having a switching terminal (83) selectively connecting either one (77, 78) of said paired transistors in circuit with said first transistor (76) or, upon operation of the tester switch means (64, 65, 66) with said externally accessible terminals and hence with a transistor to be tested, operation of said polarity reversal switch permitting connection of a transistor to be tested of either conductivity type (NPN; PNP) to said externally accessible terminals and obtain a tone from said transducer if said externally connected transistor is functioning properly.

22. Combination according to claim 20, further comprising (FIG. 5) a conductivity type reversal switch (101, 102, 103; NPN-PNP);
and wherein the transistors of said two transistors (97, 98) of the multivibrator oscillator are of first and second conductivity types (97: NPN; 98: PNP) and have mutually complementary function in the oscillator circuit, the tester switch means (93, 94, 95), selectively, connecting at least two of the electrode terminals of one (97) of said transistors in a complementary transistor oscillator circuit or to the externally accessible test terminals;
whereby a first externally connected transistor will function in the circuit to cause oscillation thereof, in place of said one transistor if it is of the same conductivity type as said one transistor and is operating properly,
the conductivity reversal switch interconnecting said two transistors (97, 98), and said externally accessible terminals (101, 103) to selectively, interchange the functional circuit of the transistors, and hence permit a transistor of reverse conductivity type with respect to said first externally connected transistor to be tested for operability in said oscillatory circuit.

23. Combination according to claim 22, wherein the test-standard switch has a first portion (93) establishing, selectively, a connection between the base of one of the transistors (97) or the external based terminal (90);
a second portion (94) establishing, selectively a connection to supply the base-emitter circuit of said one transistor (97) or to supply operating voltage to the external emitter terminal (92) and a third portion (95) to, selectively, connect the base of the other transistor (98) to the collector of the first transistor (97) or to the external collector terminal (91)
whereby a transistor of conductivity type similar to said first transistor (97) can be tested for operability in said circuit upon connection to the external terminals.

24. Combination according to claim 23, wherein the conductivity reversal switch has first portion (101) selectively connecting the external collector terminal (91) to the transducer (87);
a second portion (102) selectively connecting either the collector of the first one (97) of the transistors (97, 98) or the external base terminal (90);
and a third portion (103) selectively connecting the emitter of the second (98) of the transistors (97, 98) to the source of power (88) or establish a base by a circuit connection to the external base terminal (90), whereby a transistor of conductivity type (PNP) similar to said second transistor (98) can be tested for operability in said circuit upon connection to the external terminals by replacing the function of said second transistor (98) of the second conductivity type (PNP) and reestablishing the circuit of the first transistor (97) of the first conductivity type (NPN) of the multivibrator oscillator circuit.

25. Multi-function test apparatus to test, selectively and as desired, electrical circuits, impedance circuit components or transistors comprising a local power source (80, 88);

an ac audible signal transducer (79, 87);

a multivibrator oscillator circuit having at least two transistors (76, 77, 78; 97, 98) and a R/C network (71–74; 84–86) interconnecting said transistors and said local power source in a positive feedback oscillatory circuit, at least a portion of said R/C network and at least one of the transistors forming a frequency determining circuit to provide, upon energization by said source, an output tone from said transducer of predetermined pitch or frequency;

tester switch means (64, 65, 66; 93, 94, 95) providing a plurality of changeover switching functions;

a plurality of externally accessible test terminals (60, 90, base; 61, 91, collector; 62, 92, emitter);

said tester switch means (64, 65, 66; 93, 94, 95) being connected to said R/C network (71-74; 84-86), to at least one of the transistors (76; 97, 98) of the multivibrator oscillator and to said externally accessible test terminals and selectively connecting said R/C network to respective electrodes of said at least one transistor or to the respective externally accessible test terminals, whereby a transistor to be tested can be connected to said externally accessible terminals and take the place of at least one transistor of said at least two transistors, and the behavior of the oscillatory circuit will permit a judgement regarding the nature and operability of said transistor to be tested;

and connection of an external impedance component to two of said externally accessible terminals (61–62; 91–93) will modify the pitch or oscillatory frequency of said oscillatory circuit and permit the formation of a judgement regarding the nature and characteristics of said impedance component, wherein said multivibrator oscillator circuit, said audible signal transducer (38) and said local power source (39) form an acoustic output electrical tester (100), at least two of said externally accessible terminal (61, 62; 91, 92) forming tester output terminals (5, 6);

in combination with a multi-function testing circuit (200), said multi-function testing circuit comprising input terminals (3, 4) connectable with the acoustic tester output terminals (5, 6);

output terminals (1', 1; 2', 2) selectively connectable with a circuit or electrical circuit component to be tested;

a resistance standard circuit (22; 15, 16, 17);

a reactive impedance standard circuit (20; 12, 13, 14);

an impedance-resistance selector switch (11) selectively settable to test resistance components or reactive impedance components;

a test-standard transfer switch means (7, 8) having switch terminals connected to at least one (1) of the output terminals (1, 2), at least one (3) of the input terminals (3, 4) and selectively connecting the resistance standard circuit, or the impedance standard circuit, as selected by said impedance-resistance selector switch (11) to permit establishing when said test-standard transfer switch means is (a) in the "standard" position, a closed circuit from the input terminals through the selected standard circuit while disconnecting the output terminals and cause generation of a tone in the transducer (38) of the tester (100); and when (b) in the "test" position, a closed circuit from the input terminals (3, 4) to the output terminals (1', 1; 2', 2), and thus permit comparison of the pitch of the tone from the transducer (38) of the tester (100) as the transfer switch is operated, and hence a judgment of deviation of the tone from the transducer when the connection is changed, respectively, between the standard circuit and a test component connected to the output terminals.

26. Apparatus according to claim 25, further comprising (FIG. 4) a polarity reversal switch (81, 82, 83; NPN-PNP) connected to said local power source (80);

and wherein said multivibrator oscillator circuit of the accoustic output tester (100) has a first transistor (76) of a first conductivity type (NPN) and paired second and third transistors (77, 78) of respectively different conductivity types (77: NPN; 78: PNP);

said tester switch means (64, 65, 66) being connected to said first transistor (76), the first transistor having a first function in said circuit and each of the paired transistors having another function in said circuit, said first transistor being connected to both of the paired second and third transistors;

said polarity reversal switch having a switching terminal (83) selectively connecting either one (77, 78) of said paired transistors in circuit with said first transistor (76) or, upon operation of the tester switch means (64, 65, 66) with said externally accessible terminals and hence with a transistor to be tested, operation of said polarity reversal switch permitting connection of a transistor to be tested of either conductivity type (NPN; PNP) to said externally accessible terminals and obtain a tone from said transducer if said externally connected transistor is functioning properly.

27. Apparatus according to claim 25, further comprising (FIG. 5) a conductivity type reversal switch (101, 102, 103; NPN-PNP);

and wherein the transistors of said two transistors (97, 98) of the multivibrator oscillator are of first and second conductivity types (97: NPN; 98: PNP) and have mutually complementary function in the oscillator circuit, the tester switch means (93, 94, 95), selectively, connecting a least two of the electrode terminals of one (97) of said transistors in the complementary transistor oscillator circuit or to the externally accessible test terminals, whereby a first externally connected transistor will function in the circuit to cause oscillation thereof, in place of said one transistor if it is of the same conductivity type as said one transistor and is operating properly, the conductivity reversal switch interconnecting said two transistors (97, 98), and said externally accessible terminals (101, 103) to selectively, interchange the functional circuit of the transistors, and hence permit a transistor of reverse conductivity type with respect to said first externally connected transistor to be tested for operability in said oscillatory circuit.

28. Apparatus according to claim 27, wherein the test-standard switch has a first portion (93) establishing, selectively, a connection between the base of one of the transistors (97) or the external based terminal (90);

a second portion (94) establishing, selectively a connection to supply the base-emitter circuit to said one transistor (97) or to supply operating voltage to the external emitter terminal (92) and a third portion (95) to, selectively, connect the base of the other transistor (98) to the collector of the first transistor (97) or to the external collector terminal (91)

whereby a transistor of conductivity type similar to said first transistor (97) can be tested for operability in said circuit upon connection to the external terminals.

29. Apparatus according to claim 28, wherein the conductivity reversal switch has first portion (101) selectively connecting the external collector terminal (91) to the transducer (87);

a second portion (102) selectively connecting either the collector of the first one (97) of the transistors (97, 98) or the external base terminal (90);

and a third portion (103) selectively connecting the emitter of the second (98) of the transistors (97, 98) to the source of power (88) or establish a base by a circuit connection to the external base terminal (90), whereby a transistor of conductivity type (PNP) similar to said second transistor (98) can be tested for operability in said circuit upon connection to the external terminals by replacing the function of said second transistor (98) of the second conductivity type (PNP) and reestablishing the circuit for the first transistor (97) of the first conductivity type (NPN) of the multivibrator oscillator circuit.

30. Test apparatus and combination according to claim 25, wherein said reactive impedance standard circuit includes an adjustable capacitor means (20).

31. Apparatus according to claim 25, wherein the impedance standard circuit (20; 12, 13, 14) includes a network resistance (18) which is connected to the test-standard transfer switch means (7, 8) and in circuit with the input terminals (3, 4) when said test-standard transfer switch is in the "standard" position to provide an R/C circuit across said input terminals (3, 4) of known, predetermined value;

and a comparison resistor (19) of a value matched to the resistance value of said network resistor (18) connected to the test-standard transfer switch means (7, 8) and in circuit with the output terminals (1, 2) when said test-standard transfer switch is in the "test" position to provide an R/C circuit which has a reflected resistance appearing at the input terminals (3, 4) which matches the resistance of the reactive impedance standard circuit.

32. Apparatus according to claim 25, wherein the multi-function testing circuit (200) includes a network test section (202) comprising a diode component (25) in series with one (1) of the output terminals;

an R/C network (24, 26) having resistance and capacitance components (24, 26), in series/parallel connection with said output terminals (1, 2);

a network test switch means (9, 10) shunting components of said network test section (202) and connected serially with said output terminals (1, 2) and disconnecting components connected across said output terminals to disable circuit effects of said components (24, 25, 26) when the testing circuit is used for component testing by means of said impedance-resistor selector switch (11), and to place the components of said network test section (202) in circuit with the input terminals to permit connection of an external voltage carrying circuit to said input terminal (1, 2).

33. Apparatus according to claim 25, wherein the output terminals (1', 2') of said multi-function testing circuit (200) form intermediate outputs;

and wherein the multi-function testing circuit includes (FIG. 2) an amplifier section (205) having a control amplifier (50, 51) and connected to the intermediate outputs (1', 2'), a voltage divider (46) connected across the intermediate outputs (1', 2');

means (47) connecting a voltage taken off a tap from the voltage divider to a control junction (50') of the amplifier to control the amplification thereof;

final output terminals (41, 42) connectable to external electrical means;

and coupling means (42', 48, 52) connecting the final output terminals (41, 42) to the control junction (50') of the amplifier to control the amplification of said amplifier as a function of the electrical circuit parameters of the external electrical means.

34. Multi-function test apparatus to test, selectively and as desired, electrical circuits, impedance circuit components or transistors comprising a local power source (80);

an ac audible signal transducer (79);

a multivibrator oscillator circuit having a first transistor (76) of a first conductivity type (NPN) and paired second and third transistors (77, 78) of respectively different conductivity types (77: NPN; 78: PNP) and a R/C network (71-74; 84-86) interconnecting said transistors and said local power source in a positive feedback oscillatory circuit, at least a portion of said R/C network and at least one of the transistors forming a frequency determining circuit to provide, upon energization by said source, oscillatory energy from said at least one transistor to the audible signal transducer to obtain an output tone from said transducer of predetermined pitch or frequency;

tester switch means (64, 65, 66) providing a plurality of changeover switching functions connected to said first transistor (76), the first transistor having a first function in said circuit and each of the paired transistors having another function in said circuit, said first transistor being connected to both of the paired second and third transistors;

a polarity reversal switch (81, 82, 83; NPN-PNP) connected to said local power source (80);

said polarity reversal switch having a switching terminal (83) selectively connecting the base of either one (77, 78) of said paired transistors in circuit with said first transistor (76)

a plurality of externally accessible test terminals (60, base; 61, collector; 62, emitter);

said tester switch means (64, 65, 66) being connected to said R/C network (71-74), to at least one of the transistors (76) of the multivibrator oscillator and to said externally accessible test terminals and selectively connecting said R/C network to respective electrodes of said at least one transistor or to the respective externally accessible test terminals to modify the pitch or oscillatory frequency of said oscillatory circuit and permit the formation of a judgement regarding the nature and characteristics of an impedance omponent upon operation of the tester switch means to one position and connection of the external impedance component to two of said externally accessible terminals (61-62)

and upon operation of the tester switch means to another position and connection of transistor to be tested to said externally accessible terminals and said transistor to be tested will take place of one transistor of said paired second transistor, and permit a judgement regarding the nature and operability of said transistor to be tested based on the behavior of the oscillatory circuit and to permit connection of a transistor of either conductivity type (NPN; PNP) to be tested to said externally accessible terminals upon operation of said polarity reversal switch and obtain a tone from said transducer if said externally connected transistor is functioning properly.

35. Multi-function test apparatus to test, selectively and as desired, electrical circuits, impedance circuit components or transistors of either conductivity type comprising a local power source (88)

an ac audible signal transducer (87);

a multivibrator oscillator circuit having two transistors (97, 98) of respectively opposite first and second conductivity type and a R/C network (84-86) interconnecting said transistors and said local power source in a positive feedback audio oscillatory circuit in which the transistors have complementary functions, at least a portion of said R/C network and at least one of the transistors forming a frequency determining circuit to provide, upon energization by said source, oscillatory energy from said at least one transistor to the audible signal transducer to obtain an output tone from said transducer of predetermined pitch or frequency;

tester switch means (64, 65, 66; 93, 94, 95) providing a plurality of changeover switching functions and selectively, connecting at least two of the electrode terminals of one (97) of said transistors in the complementary transistor oscillator circuit, or to the externally accessible test terminals, a plurality of externally accessible test terminals (90, base; 91, collector; 92, emitter);

a conductivity type reversal switch (101, 102, 103; NPN-PNP);

said tester switch means (93, 94, 95) being connected to said R/C networks (84-86), to at least one of the transistors (97, 98) of the multivibrator oscillator and to said externally accessible test terminals and selectively connecting said R/C network to respective electrodes of said at least one transistor or to the respective externally accessible test terminals, to cause oscillation of the circuit upon external connection into the circuit of a transistor to be tested and in place of one transistor if it is of the same conductivity type as said one transistor and is operating properly, the conductivity reversal switch interconnecting said two transistors (97,98), and said externally accessible terminals (101, 103) to selectively, interchange the functional circuit of the transistors, and hence permit a transistor of reverse conductivity type with respect to said first externally connected transistor to be tested for operability in said oscillatory circuit;

and connection of an external impedance component to two of said externally accessible terminals (61-62; 91-92) to modify the pitch or oscillatory frequency of said oscillatory circuit and permit the formation of a judgement regarding the nature and characteristics of said impedance component.

36. Apparatus according to claim 35, wherein the tester switch means is a test-standard switch having a first portion (93) establishing, selectively, a connection between the base of one of the transistors (97) or the external based terminal (90);

a second portion (94) establishing, selectively a connection to supply the base-emitter circuit of said one transistor (97) or to supply operating voltage to the external emitter terminal (92) and a third portion (95) to, selectively, connect the base of the other transistor (98) to the collector of the first transistor (97) or to the external collector terminal (91)

whereby a transistor of conductivity type similar to said first transistor (97) can be tested for operability in said circuit upon connection to the external terminals.

37. Apparatus according to claim 36, wherein the conductivity reversal switch has first portion (101) selectively connecting the external collector terminal (91) to the transducer (87);

a second portion (102) selectively connecting either the collector of the first one (97) of the transistors (97, 98) or the external base terminal (90);

and a third portion (103) selectively connecting the emitter of the second (98) of the transistors (97, 98) to the source of power (88) or establish a base by a circuit connection to the external base terminal (90), whereby a transistor of conductivity type (PNP) similar to said second transistor (98) can be tested for operability in said circuit upon connection to the external terminals by replacing the function of said second transistor (98) of the second conductivity type (PNP) and reestablishing the circuit for the first transistor (97) of the first conductivity type (NPN) of the multivibrator oscillatory circuit.

* * * * *